United States Patent
Jaber

(10) Patent No.: US 7,028,239 B2
(45) Date of Patent: Apr. 11, 2006

(54) MICROPROCESSOR ON-CHIP TESTING ARCHITECTURE AND IMPLEMENTATION

(75) Inventor: Talal K. Jaber, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 743 days.

(21) Appl. No.: 09/751,750

(22) Filed: Dec. 29, 2000

(65) Prior Publication Data

US 2002/0087931 A1 Jul. 4, 2002

(51) Int. Cl.
*G01R 31/28* (2006.01)

(52) U.S. Cl. .................... 714/733; 714/738
(58) Field of Classification Search .............. 714/30, 714/726, 727, 25, 728–739; 713/601
See application file for complete search history.

(56) References Cited

U.S. PATENT DOCUMENTS

| | | | | |
|---|---|---|---|---|
| 5,925,144 A | * | 7/1999 | Sebaa | 714/733 |
| 5,983,380 A | * | 11/1999 | Motika et al. | 714/733 |
| 6,184,810 B1 | * | 2/2001 | Burns | 341/143 |
| 6,349,392 B1 | * | 2/2002 | Swoboda et al. | 714/30 |
| 6,557,129 B1 | * | 4/2003 | Rajski et al. | 714/729 |

* cited by examiner

*Primary Examiner*—Guy J. Lamarre
(74) *Attorney, Agent, or Firm*—Kenyon & Kenyon

(57) ABSTRACT

A method and apparatus are presented for on-chip testing of circuits in testing channels. In an embodiment of the present invention, the system includes a weight selector that allows for a wide variety of weighting of test data that is to be supplied to the testing channels. For example, the weight selector may be used to weight all bits in all channels or individual bits in a particular channel. Clock control and diagnostic logic may also be provided to selectively supply scan, functional, and/or stop clock signals to the testing channels. Channel filtering logic may be also provided to mask output data from a selected testing channel as desired. The method and apparatus may provide improved testing performance and power savings.

18 Claims, 4 Drawing Sheets

MICROPROCESSOR ON-CHIP TESTING ARCHITECTURE AND IMPLEMENTATION

BACKGROUND OF THE INVENTION

The present invention pertains to on-chip test circuitry. More particularly, the present invention pertains to a logical built-in self test (LBIST) circuit for selectively testing channels in a microprocessor or other complex semiconductor circuitry.

There are numerous on-chip test circuitry schemes available in the art. For example, the IEEE 1149.1 (Joint Test Action Group (JTAG) 1990), provides an on-chip testing system that includes a scan chain. The scan chain includes a plurality of elements, where each element includes a flip-flop or latch. During initialization, a first set of input data is provided to the first flip-flop of each of the test channels. A scan clock is used to move this data from the first flip-flop into the test channel. At the same time, the next set of input data is provided to the first flip-flops. Each scan chain element is coupled to a subset of logic on the chip to be tested (i.e., the test channel). The initialization procedure continues until the desired data for each scan chain element is loaded into the corresponding flip-flops. A functional clock can then be used to operate the logic to be tested to utilize the data. The output data for the logic is provided to the next flip flop so that it can be moved on to one or more successive flip-flops until it reaches off chip drivers or the like for analysis. Thus, based on known input data, the logic to be tested will take this data and provide expected output data. If there is a difference between the actual output data and the expected output data, then there is an error in the tested logic.

In a JTAG system, the chip is typically coupled to a testing system. Via the testing system, certain registers on the chip may be loaded with desired values and/or read. Data tends to be input through a test access port (TAP) for the chip. There are several problems, however, with the JTAG systems that are present in the art. First, test data generation and diagnostics are done off-chip, which can lead to limited test coverage due to test data volume and/or excessive test time. Second, performing LBIST testing consumes a vast amount of power, in part because of the large number of clocking signals that are generated and because of the large number of electrical nodes that toggle simultaneously during LBIST. Third, result data from the LBIST scan channels often results in a lot of data which is unnecessary or not needed.

In view of the problems set forth above, there is a need for an on-chip testing architecture that improves the tester's ability to generate test data, diagnose problems, conserve power, and filter or mask results.

DETAILED DESCRIPTION

Figure 1:
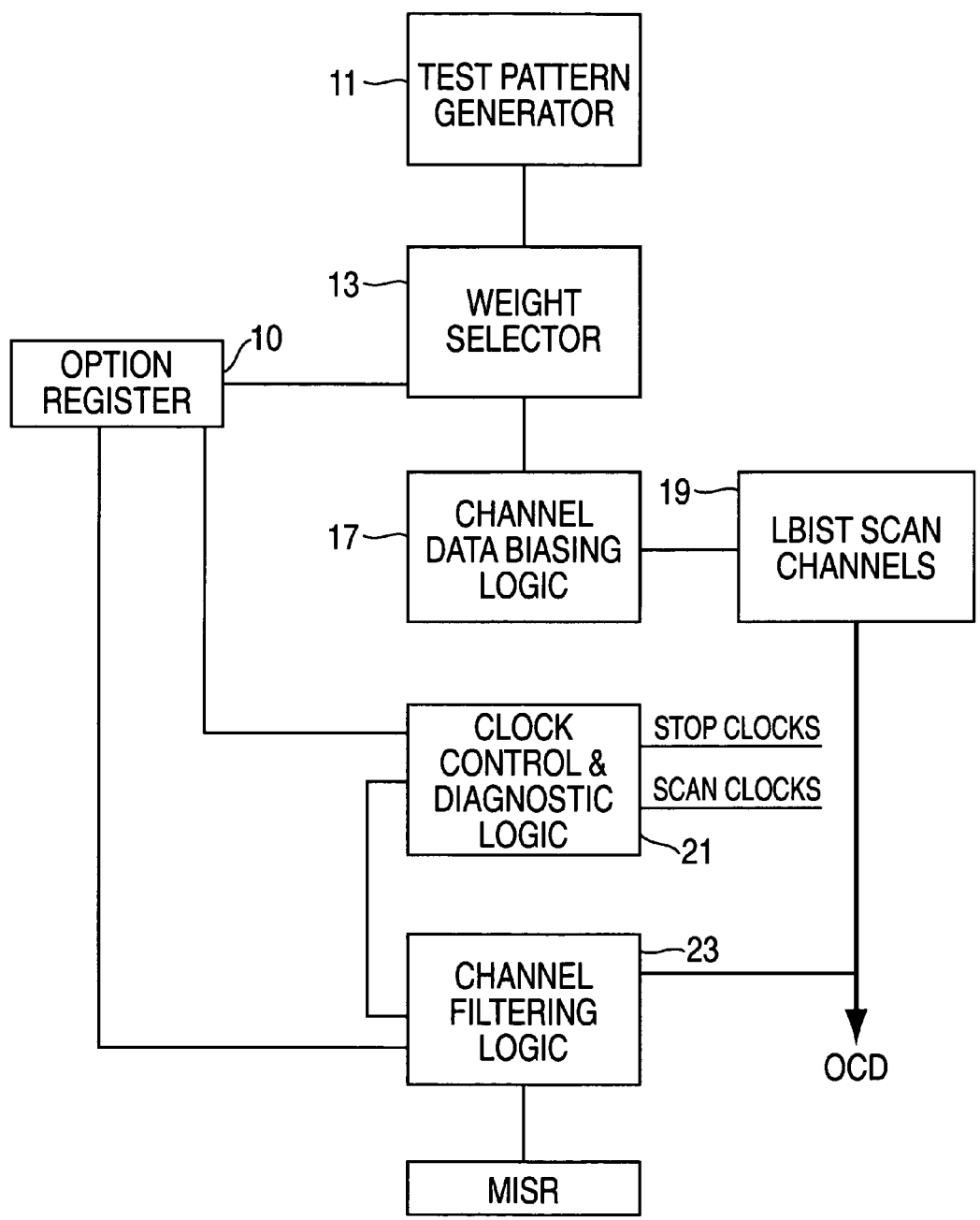
FIG. 1 is a block diagram of an LBIST architecture constructed according to an embodiment of the present invention.

Referring to FIG. 1, a general block diagram of an LBIST architecture is shown constructed according to an embodiment of the present invention. A pattern generator 11 provides raw data to be input into test circuitry on the chip. A weight selector 13 is coupled to pattern generator 11 to provide a particular weighting of the raw data based on the value in option register 10. The output of the weight selector is supplied to channel data biasing logic 17, which, in turn supplies the data to the LBIST scan channels 19 (e.g., such as those that are known in the art). Clock control & diagnostic logic 21 generates stop and scan clocks for the LBIST scan channels. The scan clocks are a pair of clocking signals supplied to each scan chain element and are used to move data between the LBIST scan channels by controlling the latches or flip-flops present in these elements. A third clock may be used as a functional clock (i.e., one that is used by the logic that is being tested in the LBIST channel).

Outputs from the LBIST scan channels are provided to an off-chip testing device as well as to channel filtering logic 23, which in turn is coupled to the clock control & diagnostic logic 21 and the option register 10. In operation, the channel filtering logic 23 allows a user to select which of the LBIST scan channels are to supply data to a multiple input signature register (MISR).

Figure 2:
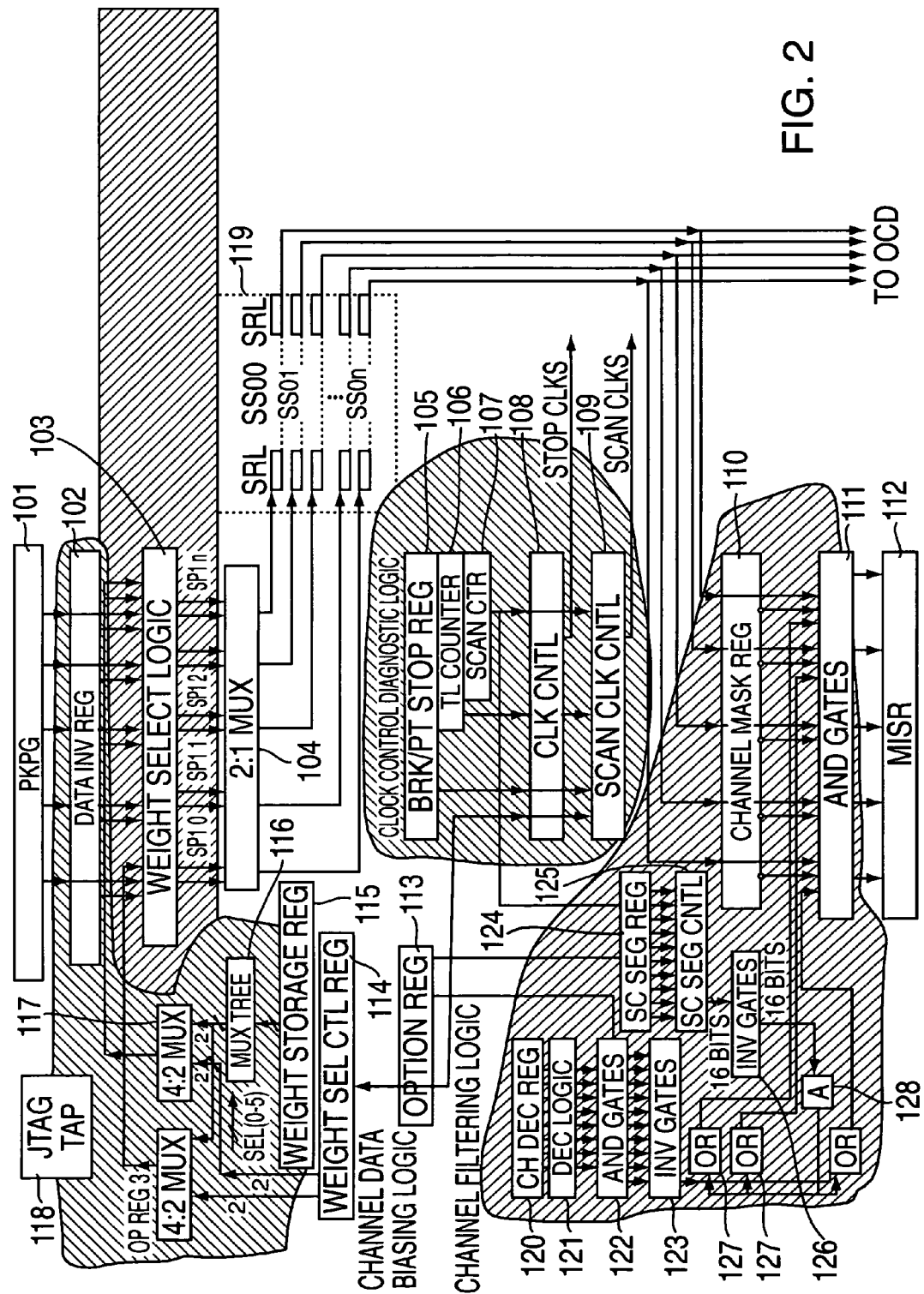
FIG. 2 is an example of a more detailed block diagram of the LBIST architecture of FIG. 1.

Referring to FIG. 2, a more detailed block diagram of the LBIST architecture of FIG. 1 is shown. In this embodiment, the pattern generator is implemented as a pseudo random pattern generator (PRPG) 101 generating a 128-bit value. This value is then fed through a data inverter register 102, which may be implemented with a set of 128 control-only scan flip-flops to control whether the data going into a certain LBIST channel is inverted or not (as described below). Weight select logic 103 receives the output of the PRPG 101 and data inverter register 102 and weights the bits based on two-bit values supplied by multiplexers 117. In this embodiment, there is a two-bit value (S1S2) for each bit output by the PRPG 101. The generation of the these bits and how they are used to weight the bits from the PRPG 101 is discussed below.

The generation of the S1S2 value starts with the Weight Select Control Register 115 in this embodiment. In this example, the PRPG 101 generates 128 bits (one bit per LBIST channel). Register 115 is 256 bits wide and these bits are supplied to 128 4:2 multiplexers 117. A weight storage register 115 may be 128 or 256 bits wide depending on the granularity of the biasing of test data within a particular LBIST scan channel. The weight storage register may be loaded and programmed via the JTAG TAP as any other TDR (test data register). The contents of the weight storage register 115 may be pumped down a particular LBIST scan channel to control a certain segment of the channel scan bits. In this example, the "depth" of a scan channel is the number of bits of data that are input to each scan channel. In this embodiment, the depth of the scan channel is 1024 bits that may be divided into 16 segments of 64 bits each. The segment may be 64 bits for a 128-bit wide wide weight storage register of 128 bits for a 256-bit wide register. The biasing values can be determined by running the existing Weighted Pattern Test generation algorithms, which are well known in the art. The weighted storage register can also be useful in forcing a segment of an LBIST scan channel to a deterministic value every time a scan load takes place. In other words, each bit of the segment can be set to a desired value.

Figure 3:
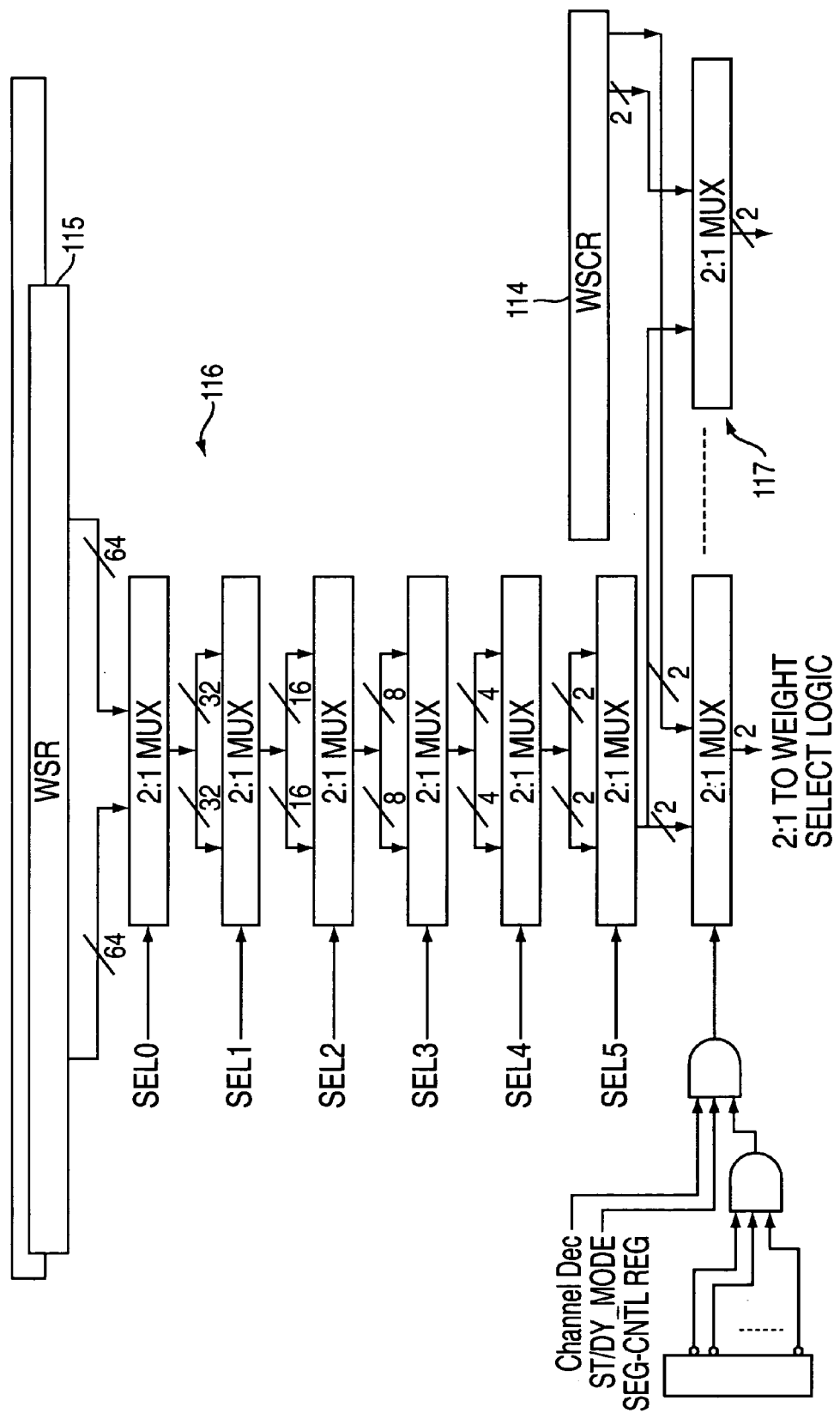
FIG. 3 is block diagram of a weight storage register and multiplexer tree constructed according to an embodiment of the present invention.

In this example, the 128 bits from the weight storage register 115 are supplied to a multiplexer (MUX) tree 116 that has six select inputs. The MUX tree 116 of this embodiment is shown in more detail in FIG. 3. The MUX tree 116 allows addressing within the weight storage register so that all bits within a particular scan segment of an LBIST scan channel are biased. In this embodiment, the select signals (SEL0 to SEL5) mirror the least significant bits of the scan counter 106. As discussed below, the scan counter 106 presents the number of scan clocks that have been supplied to the LBIST scan channels. Thus, the lower six bits of the scan counter identify one bit in a segment of the LBIST scan channel data. The four most significant bits of the scan counter represent a segment within an LBIST scan channel to be biased. As seen in FIG. 3, the 128 bits from the weight storage register (WSR) 115 are provided to successive 2:1 MUX's, such that SEL0 selects either the most significant 64 bits or least significant 64 bits, SEL1 selects either the 32 most significant bits of the result or the 32 least significant bits of the result, and so on. SEL5 selects two bits which are output to the series of 4:2 MUX's 117 described above. Thus, two bits in each 4:2 MUX are supplied by the MUX tree 116 and two bits are supplied by the weight select control register (WSCR) 114. In this embodiment, the selection between the two pairs may be made by the option register (e.g., OP REG bit 3 as shown in FIG. 2) or by a combination of a Channel Decode (Channel Decode) signal and ST/DY (Static/Dynamic) Mode signal and a segment control register as shown in FIG. 3. The Channel Decode and ST/DY bits may be supplied as enable-type bits from the option register 113 or another source while the segment control register can be a scannable register that outputs all 1 values when the four most significant bits of the scan counter reach a desired segment. Thus, assuming that the Channel Decode and ST/DY bits are one, the two bits output by the multiplexer tree 116 will be selected in MUX's 117 when the four most significant bits of the scan counter reach the segment to be biased. The selected pair is then used to weight the 128 bits output by the weight select logic 103 described above.

Figure 4:
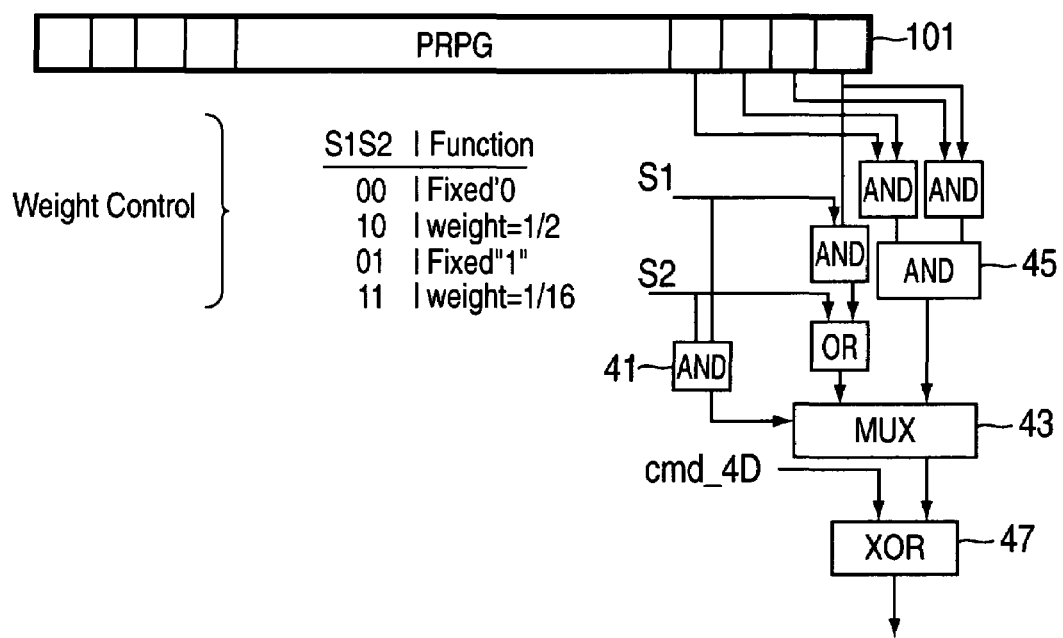
FIG. 4 is a block diagram of a weight select logic circuit constructed according to an embodiment of the present invention.

The weighting of the bits from the PRPG 101 and the data inverter register 102 is shown in FIG. 4. Each bit is first ANDed with the S1 bit, then the result is ORed with the S2 bit. If the bits are set to 00, then the corresponding bit from the PRPG 101 would be changed to a 0. If the bits are set to 01, then the corresponding bit from the PRPG 101 would be changed to a 1. A 10 value would leave the bit unchanged (i.e., weighted by ½). If both S1 and S2 are 1, then these bits cause the output of AND gate 41 to output a one and select an output via MUX 43 that is an ANDing of four bits from the PRPG 101. Since the four bits are randomly generated, AND gate 45 will output a 1 on average 1 out of 16 times. Thus, when S1 and S2 are both 1, it results in a weighting of 1/16th. The output of MUX 43 is suppled to an XOR gate 47, which XORs it with the bit cmd_4D. The value for cmd_4D is controlled by the data inverter register 102. Thus a 1 bit for this particular channel would cause the output of MUX 43 to be inverted by XOR gate 47, and a 0 bit would leave the output of MUX 43 unchanged by XOR gate 47. The output of the weight select logic 103 is supplied to a MUX 104. In addition to the weight select logic 103 output, the chip primary scan input pin can supply another selectable set of inputs (i.e., the existing pins for the chip) as well as the primary scan output of the scan chain (i.e., the data signals being provided to off-chip testing circuitry). The outputs of MUX 104 are supplied to the LBIST scan channels 119, and clocked into the appropriate scan channels using the scan clocks, described in more detail below.

The clock control & diagnostic logic includes a breakpoint-stop register 105 that may be used to stop the LBIST test on any scan or function cycle. A scan cycle refers to the scan clock signals provided to the LBIST scan channels to move data into and out of the scan channels. A function cycle refers to the clocked operation of the logic being tested in the LBIST scan channels. This is useful in a debug or diagnostic mode where it is desirable to stop the test on the first fail. The breakpoint stop register may be programmed with any value reflecting the intended contents of the TL (test loop) counter 106 and the scan counter 107. In this embodiment, the scan counter is a 10-bit counter while the TL counter is a 16-bit counter. The scan counter may include a 4-bit finite state machine (FSM) to control the scan clocks. When the TL counter 106 and the scan counter 107 reach the value loaded into the Breakpoint stop register 105 (and if the option register is programmed accordingly), then the appropriate signals may be generated to stop the function clocks and the scan clocks. At this point the current values in the LBIST channels may be forwarded out for analysis.

In this embodiment, an LBIST test loop is defined as the sequence of scan cycles followed by the standard one or two function (system) cycles. The number of scan cycles usually varies depending on how deep the LBIST scan chains are. Normally the number of scan cycles must be equal or greater than the number of scan latches/flip-flops within the deepest LBIST scan chain. The TL counter keeps count of how many LBIST test loops have accumulated since the start of the test. Typically, a Test Loop counter 106 should not be any wider than 16 bits. The scan counter 107 is used to count the number of scan cycles within a particular LBIST test loop. It also controls the generation of the scan clocks during LBIST. An overflow bit from the most significant bit of the scan counter conditionally scans the test loop counter to increment by one after the system cycle(s) have occurred.

A clock control 108 is provided coupled to the breakpoint stop register 105, test loop counter 106 and scan counter 107 and option register 10. Clock control 108 allows independent control of the stop clocks for the LBIST scan channels. The scan clock control 109 is coupled to scan counter 107, test loop counter 106, the Breakpoint stop register 105 and the option register 113. The clock control 109 allows independent control of the scan clocks for all LBIST channels or a subset of them.

The resulting bits from the LBIST scan channels are supplied to a channel mask register 110. This mask register may be a scan-only register addressable as a TDR by the JTAG TAP. In this embodiment, the channel mask register is a 128-bit register. Each 0 bit loaded into the register indicates an LBIST channel that is not to be compressed into the MISR. In addition, the channel filtering logic, described below, may be used to further filter out a subset of the bits supplied by the channel mask register and prevent them from feeding the MISR (Multiple Input Signature Register) 112. The data received at one or more MISRs 112 are compressed into signatures for further analysis. The channel filtering logic includes a channel decode register 120 which is a 7-bit scannable register in this embodiment to address 1 out of 128 LBIST channels. It may be loaded and unloaded via the JTAG port 118 as a TDR (test data register). The channel filtering logic outputs a 7-bit value indicating which LBIST channel is to be masked. This 7-bit value is received by decode logic 121 that outputs a 128-bit value. In this embodiment, only one of the bits is set to "1" based on the 7-bit value received. The 128-bit value is output to a logic block (e.g., AND gates 122) along with a Channel Decode Mode bit from the option register 113. In this embodiment, if the Mode bit is set to "0" then no channel masking is to be performed in the channel filtering logic. If the mode bit is set to "1", then the bit set to one by the decode logic 121 will be supplied to inverter gates 123. The inverter gates invert all of the bits output by AND gates 122. These bits are supplied to a bank of 128 OR gates 127. The other input to the OR gates 127 is supplied by AND gate 128.

To generate the inputs to the AND gate 128, an LBIST scan channel segment control register 124 is provided that may be used to address 1 out of 16 segments within an LBIST scan channel. As with the channel decode register, it may be loaded an unloaded via the JTAG port as a TDR register. The 16-bit value from the scan segment register 124 is supplied to a scan channel segment control register 125. Control register 125 is a 16-bit scannable register that is used to control the data compression of 1 out of 16 segments within an LBIST scan channel. It may be loaded and unloaded via the JTAG port as a TDR register. All 16 bits of the control register are set by logic equations involving the SC_Mode bit of the Option register 113, the 4 MSB bits of the LBIST Scan Counter and the 16 bits of the scan segment register 124. As an example, a user may desire to mask off segment 8 of the LBIST channel 1 when the LBIST is running. To achieve this, first the scan segment register 124 is set to 0000000010000000 (i.e., the bit in position 8 is selected). Second, the content of the channel decode register 120 is set to 0000001 to select channel 1 of 128. Third, the SC_Mode bits of the option register 113 is set to 1 to enable the masking operation. Fourth, the four most significant bits of the scan counter 117 points to the selected segment (8 in this example). The scan segment control register 125 outputs all 0's when the selected segment is matched and the SC_Mode bit is set to 1. The output of the scan segment control register 125 is coupled to inverter gates 128 that invert the bits and supply them to AND gate 128. Thus, if the output of the Segment Control register 125 is all 0's then the output of AND gate 128 will be a 1. The output of AND gate 128 is inverted and supplied to OR gates 127. Thus, if the output of AND gate 128 is a 0, then all of the outputs of OR gates 127 will be 1. These "1" values are supplied as inputs to AND gates 111 and are ANDed with the bits from the channel mask register 110 (either the actual signals from the LBIST channels or the complements of them depending on the value initially loaded into the channel mask register 110). On the other hand, if the output of AND gate 128 is a 1, then 0 values are supplied as inputs to the OR gates 127 enabling the channel filtering logic. This is because the channel selected in the channel decode register 120 will have a 0 value supplied to its corresponding OR gate in bank 127. For the selected channel, the OR gate will output a 0 value (during the selected segment) which will be ANDed with the LBIST channel bits for that channel (effectively masking them out).

The option register 113 is a 32-bit register coupled to the other components of the LBIST architecture described above. As indicated above, the option register may be used to determine which LBIST channel(s) scan clocks are activated; what sort of biasing of the test vectors generated by the PRPG 101 should be performed; whether one or two system cycles are to take place during LBIST; what channels are to be masked off during LBIST; what functional clocks are allowed during LBIST; etc. The option register 113 may also be used to run LBIST in a stop on first error (SOFE) mode. In such a mode, when a faulty MISR signature is received, the faulty channel may be ascertained from the MISR and the faulty functional clock cycle may be discerned from the test loop counter. Knowing this information, the appropriate value may be stored in the breakpoint stop register to cause the LBIST test to stop on the desired error and the result clocked out for analysis.

The LBIST architecture described above provides on-chip diagnostic logic, power management logic, and test coverage. For diagnostic logic, the channel filtering logic and channel mask register work to isolate not only LBIST channels, but may also be used to isolate segments of an LBIST channel. The breakpoint stop register allows the LBIST test to stop on scan or system cycles. This allows for the detection of the first fail that results in a faulty MISR signature. With this information the faulty channel and segment may be isolated and the breakpoint stop register appropriately programmed to stop on the appropriate functional clock value.

For power management, the power consumption caused by scan clocks may be excessive, both in toggling data through the LBIST scan channels and in operating the tested logic in those channels. The scan clock control 108 may be used to turn off scan clocks to lower power consumption during testing of other LBIST channels. Also, a weight factor of 0 or 1 may be used to prevent toggling activity when scanning data into and out of the LBIST scan channels (i.e., data values will no longer toggle between 1 and 0, but will remain at a constant value). In this embodiment, the scan clock frequency is ⅛th that of the functional clock frequency to provide further power reduction since much of the power expenditure during LBIST testing is due to scanning data into and out of the LBIST scan channels.

For test coverage, the weight select control register and weight storage register may be used to control weighting of the pseudo-random numbers generated by the PRPG 101. These registers may also be used to force particular values to be loaded into the LBIST scan channels. Also, individual scan channels and segments may be masked out so that data cannot be scanned into a scan channel or the functional clock for the scan channel may be disabled. This may be helpful in dealing with orthogonal signals (i.e., signals that could cause a contention on a particular circuit node if two or more signals happen to be in the active state at the same time). The Weight Select Control Register 115 may also be used to at Power-On-Reset (POR) time to flush the chip scan strings to all 0's or all 1's by setting its output to all 00's or all 01's, respectively.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. An on-chip testing apparatus comprising:
    a test pattern generator to generate test data for a plurality of testing channels; and
    a weight selector coupled to said test pattern generator, said weight selector to store weighting values to bias data for at least one of said testing channels wherein said weight selector includes a weight storage register to store said weighting values and said weight selector is to selectively bias individual bits of said test data.

2. The apparatus of claim 1 wherein said weight selector causes a reduction in power usage when said weight storage registers store weighting values to bias data for at least one testing channels to one of all 0 values and all 1 values.

3. An on-chip testing apparatus comprising:
a test pattern generator to generate test data for a plurality of testing channels;
clock control logic to selectively supply scan clocking signals to said testing channels, such that said scan clocking signals scan said test data into said testing channels wherein in biasing test data, said biasing is performed selectively on individual bits of said test data.

4. The apparatus of claim 3 further comprising:
a signature register coupled to said testing channels to receive data from said testing channels when said scan clocking signals are supplied to said testing channels.

5. An on-chip testing apparatus comprising:
clock control logic to selectively supply functional clocking signals to a plurality of testing channels, such that said functional clocking signals operate logic in said testing channels wherein in biasing test data, said biasing is performed selectively on individual bits of said test data.

6. The apparatus of claim 5 wherein said clock control logic further includes clock control logic to generate stop clock signals to said testing channels.

7. The apparatus of claim 6 wherein said clock control logic further includes a scan counter counting said functional clocking signals and a breakpoint stop register to store a value such that at least one of said stop clock signals is generated when a count in said scan counter matches a value in said breakpoint stop register.

8. An on-chip testing apparatus comprising:
channel filtering logic to receive data from a plurality of testing channels, said channel filtering logic to mask output data from a selected testing channel wherein in biasing test data, said biasing is performed selectively on individual bits of said test data.

9. The apparatus of claim 8 further comprising:
a signature register coupled to said channel filtering logic to receive said data.

10. A method of performing on-chip testing comprising:
generating test data in a test pattern generator for a plurality of testing channels; and
biasing said test data for at least one of the testing channels with weighting values stored in a weight selector coupled to said test pattern generator wherein said biasing is performed selectively on individual bits of said test data.

11. The method of claim 1 wherein in biasing said test data all of said test data is biased to one of all 0 values and all 1 values.

12. A method of performing on-chip testing comprising:
generating test data in a test pattern generator for a plurality of testing channels; and
selectively supplying scan clocking signals to said testing channels to scan said test data into said testing channels wherein in biasing test data, said biasing is performed selectively on individual bits of said test data.

13. The method of claim 12 further comprising:
supplying said data received from said testing channels to a signature register coupled to said testing channels.

14. A method of performing on-chip testing comprising:
selectively supplying functional clocking signals to a plurality of testing channels to operate logic in said testing channels wherein in biasing test data, said biasing is performed selectively on individual bits of said test data.

15. The method of claim 14 further comprising:
selectively generating stop clock signals to said testing channels.

16. The method of claim 15 further comprising:
counting said functional clocking signals in a scan counter; such that at least one of said stop clock signals is generated when a count in said scan counter matches a value in a breakpoint stop register.

17. A method of performing on-chip testing comprising:
receiving data from a plurality of testing channels at channel filtering logic; and
masking output data from a selected testing channel wherein in biasing test data, said biasing is performed selectively on individual bits of said test data.

18. The method of claim 17 further comprising:
supplying masked output data from said channel filtering logic to a signature register coupled to said channel filtering logic.

* * * * *